(12) United States Patent
Wang et al.

(10) Patent No.: US 7,741,648 B2
(45) Date of Patent: Jun. 22, 2010

(54) PENETRATING HOLE TYPE LED CHIP PACKAGE STRUCTURE USING A CERAMIC MATERIAL AS A SUBSTRATE AND METHOD FOR MANUFACTURING THE SAME

(75) Inventors: Bily Wang, Hsinchu (TW); Jonnie Chuang, Banciao (TW); Chia-Hung Chen, Yingge Township, Taipei County (TW)

(73) Assignee: Harvatek Corporation, Hsinchu (TW)

( * ) Notice: Subject to any disclaimer, the term of this patent is extended or adjusted under 35 U.S.C. 154(b) by 0 days.

(21) Appl. No.: 11/976,340

(22) Filed: Oct. 24, 2007

(65) Prior Publication Data

US 2009/0008656 A1 Jan. 8, 2009

(30) Foreign Application Priority Data

Jul. 6, 2007 (TW) .............................. 96124778 A

(51) Int. Cl.
*H01L 29/18* (2006.01)
(52) U.S. Cl. ......................................... 257/88; 361/761
(58) Field of Classification Search .................. 257/88, 257/98, 99, E33.005, E23.006
See application file for complete search history.

(56) References Cited

U.S. PATENT DOCUMENTS

| 4,890,383 | A  | * | 1/1990 | Lumbard et al. .............. 438/27 |
| 6,355,946 | B1 | * | 3/2002 | Ishinaga ...................... 257/98 |
| 6,392,294 | B1 | * | 5/2002 | Yamaguchi ................. 257/690 |
| 2002/0153835 | A1 | * | 10/2002 | Fujiwara et al. ............. 313/512 |
| 2005/0035357 | A1 | * | 2/2005 | Fjelstad ....................... 257/81 |
| 2005/0116235 | A1 | * | 6/2005 | Schultz et al. ................ 257/79 |

* cited by examiner

*Primary Examiner*—Steven Loke
*Assistant Examiner*—Kimberly M Thomas
(74) *Attorney, Agent, or Firm*—Rosenberg, Klein & Lee

(57) ABSTRACT

An LED chip package structure includes a ceramic substrate, a conductive unit, a hollow ceramic casing, many LED chips, and a package colloid. The ceramic substrate has a main body, many protrusions extended from the main body, many penetrating holes respectively penetrating through the protrusions, and many half through holes formed on a lateral side of the main body and respectively formed between each two protrusions. The conductive unit has many first conductive layers respectively formed on the protrusions, many second conductive layers respectively formed on inner surfaces of the half through holes and a bottom face of the main body, and many third conductive layers respectively filled in the penetrating holes. The hollow ceramic casing is fixed on the main body to form a receiving space. The LED chips is received in the receiving space. The package colloid is filled in the receiving space for covering the LED chips.

9 Claims, 8 Drawing Sheets

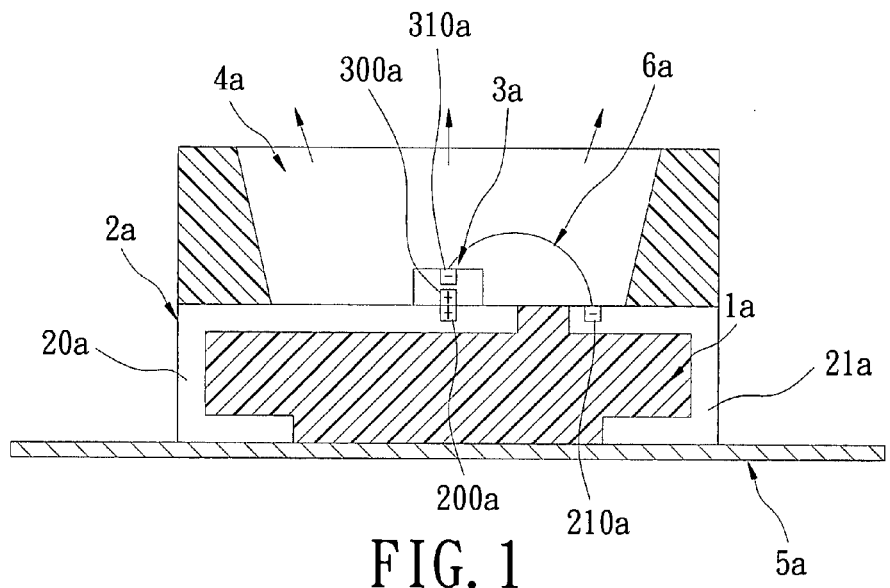
FIG. 1
PRIOR ART
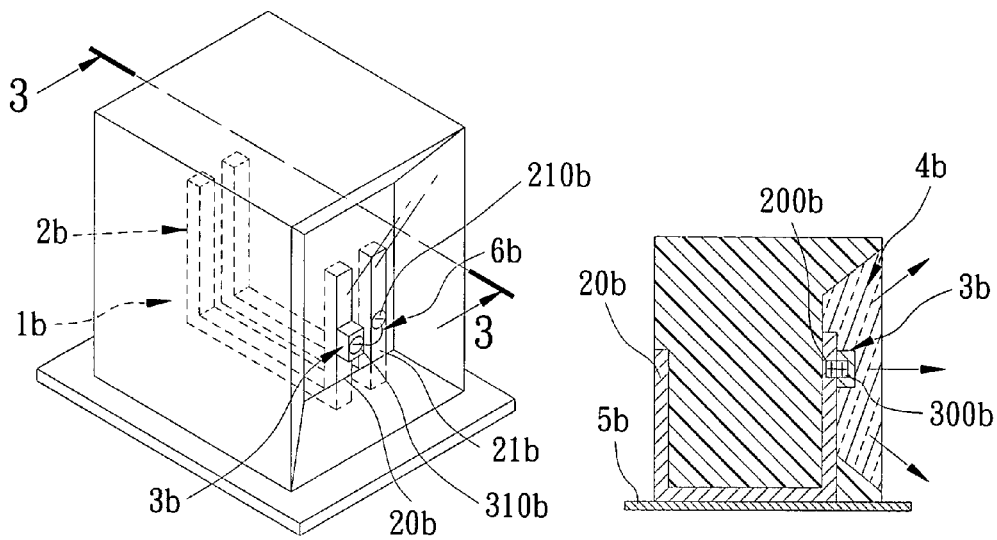
FIG. 2
PRIOR ART
FIG. 3
PRIOR ART

PENETRATING HOLE TYPE LED CHIP PACKAGE STRUCTURE USING A CERAMIC MATERIAL AS A SUBSTRATE AND METHOD FOR MANUFACTURING THE SAME

BACKGROUND OF THE INVENTION

1. Field of the Invention

The present invention relates to an LED chip package structure and a method for manufacturing the same, and particularly relates to a penetrating hole type LED chip package structure using a ceramic material as a substrate and a method for manufacturing the same.

2. Description of the Related Art

FIG. 1 shows a cross-sectional, schematic view of a vertical LED chip package structure of the prior art. The vertical LED chip package structure includes an insulative substrate 1a, a lead frame 2a, an LED chip 3a, and a fluorescent colloid 4a.

The lead frame 2a has two conductive pins 20a, 21a respectively extended along two opposite lateral sides and bent twice, so that the bottom faces of the two conductive pins 20a, 21a are electrically connected with a PCB 5a. In addition, the conductive pin 20a has a positive electrode area 200a, and the conductive pin 21a has a negative electrode area 210a.

Moreover, the LED chip 3a has a positive electrode side 300a and a negative electrode side 310a. The LED chip 3a is disposed on the conductive pin 20a directly, so that the positive electrode side 300a of the LED chip 3a is electrically connected with the positive electrode area 200a of the conductive pin 20a directly. The negative electrode side 310a of the LED chip 3a is electrically connected with the negative electrode area 210a of the conductive pin 21a via a leading wire 6a.

The fluorescent colloid 4a is covered on the LED chip 3a for protecting the LED chip 3a. Therefore, the vertical LED chip package structure should project light upwardly (such as the arrows in FIG. 1).

FIG. 2 shows a perspective, schematic view of a horizontal LED chip package structure of the prior art, and FIG. 3 shows a cross-sectional view along line 3-3 of a horizontal LED chip package structure shown in FIG. 2. The horizontal LED chip package structure includes an insulative substrate 1b, a lead frame 2b, an LED chip 3b, and a fluorescent colloid 4b.

The lead frame 2b has two conductive pins 20b, 21b respectively extended along one lateral side and bent twice, so that the bottom faces of the two conductive pins 20b, 21b are electrically connected with a PCB 5b. In addition, the conductive pin 20b has a positive electrode area 200b, and the conductive pin 21b has a negative electrode area 210b.

Moreover, the LED chip 3b has a positive electrode side 300b and a negative electrode side 310b. The LED chip 3b is disposed on the conductive pin 20b directly, so that the positive electrode side 300b of the LED chip 3b is electrically connected with the positive electrode area 200b of the conductive pin 20b directly. The negative electrode side 310b of the LED chip 3b is electrically connected with the negative electrode area 210b of the conductive pin 21b via a leading wire 6b.

The fluorescent colloid 4b is covered on the LED chip 3b for protecting the LED chip 3b. Therefore, the horizontal LED chip package structure should project light sideward (such as the arrows in FIG. 3).

However, if the conductive pins (20a, 21a, 20b, 21b) want to electrically connect with the PCB (5a, 5b), the conductive pins (20a, 21a, 20b, 21b) need to be bent twice. Therefore, the complexity of the manufacturing process in the prior art should be increased.

SUMMARY OF THE INVENTION

One particular aspect of the present invention is to provide a penetrating hole type LED chip package structure using a ceramic material as a substrate and a method for manufacturing the same. The advantage of the present invention is that a conductive layer is formed on a ceramic substrate via any forming method, and a hollow ceramic casing is fixed on a top face of the ceramic substrate via an LTCC (Low-Temperature Cofired Ceramics). Therefore, the LED chip package structure of the present invention can electrically connect with a PCB easily without bending the conductive pins as the prior art.

In order to achieve the above-mentioned aspects, the present invention provides a penetrating hole type LED chip package structure using a ceramic material as a substrate, include s: a ceramic substrate, a conductive unit, a hollow ceramic casing, a plurality of LED chips, and a package colloid. In addition, the ceramic substrate has a main body, a plurality of protrusions separated from each other and extended from a top face of the main body, a plurality of penetrating holes respectively penetrating through the protrusions, and a plurality of half through holes formed on a lateral side of the main body and respectively formed between each two protrusions.

Moreover, the conductive unit has a plurality of first conductive layers respectively formed on the protrusions, a plurality of second conductive layers respectively formed on inner surfaces of the half through holes and a bottom face of the main body, and a plurality of third conductive layers respectively filled in the penetrating holes. Each third conductive layer is electrically connected between the first conductive layer and the second conductive layer.

Furthermore, the hollow ceramic casing is fixed on the top face of the main body to form a receiving space for exposing top faces of the first conductive layer. The LED chips is received in the receiving space, wherein each LED chip has a positive electrode side and a negative electrode side respectively and electrically connected with the two different first conductive layer. The package colloid is filled in the receiving space for covering the LED chips.

In order to achieve the above-mentioned aspects, the present invention provides a method for manufacturing a penetrating hole type LED chip package structure using a ceramic material as a substrate. The method includes: providing a ceramic substrate that has a main body, a plurality of protrusions separated from each other and extended from a top face of the main body, a plurality of penetrating holes respectively penetrating through the protrusions, and a plurality of half through holes formed on a lateral side of the main body and respectively formed between each two protrusions, and then respectively forming a plurality of first conductive layers on the protrusions and respectively forming a plurality of second conductive layers on inner surfaces of the half through holes and a bottom face of the main body.

The method further includes: respectively filling a plurality of third conductive layers into the penetrating holes, and each third conductive layer being electrically connected between the first conductive layer and the second conductive layer; fixing a hollow ceramic casing on the top face of the main body to form a receiving space for exposing top faces of the first conductive layer; receiving a plurality of LED chips in the receiving space, and each LED chip having a positive electrode side and a negative electrode side respectively and electrically connected with the two different first conductive layer; and then filling a package colloid into the receiving space for covering the LED chips.

Hence, the LED chip package structure of the present invention can electrically connect with the PCB easily without bending the conductive pins as the prior art by matching the penetrating holes and the conductive layers (the first conductive layers, the second conductive layers, and the third conductive layers). In other words, the third conductive layers are respectively filled in the penetrating holes to form a plurality of conductive bridges between the first conductive layers and the second conductive layers or between the LED chips and the PCB. Therefore, the present invention can reduce manufacturing process and cost.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which:

FIG. 1 is a cross-sectional, schematic view of a vertical LED chip package structure of the prior art;

FIG. 2 is a perspective, schematic view of a horizontal LED chip package structure of the prior art;

FIG. 3 is a cross-sectional view along line 3-3 of a horizontal LED chip package structure shown in FIG. 2;

DETAILED DESCRIPTION OF THE PREFERRED EMBODIMENTS

Figure 4:
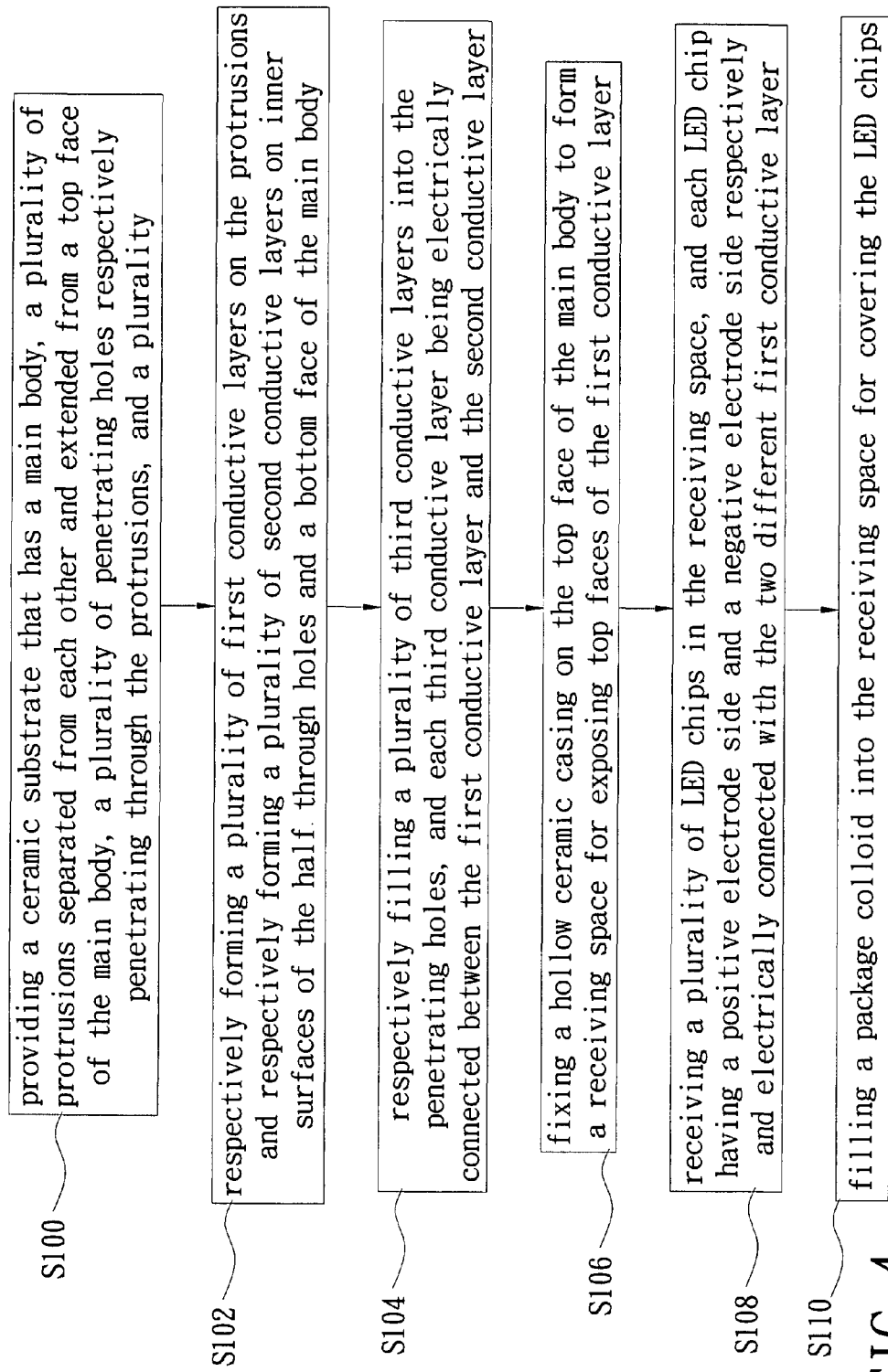
FIG. 4 is a flowchart of a method for manufacturing a penetrating hole type LED chip package structure that uses a ceramic material as a substrate according to the first embodiment of the present invention.
Figure 5A:
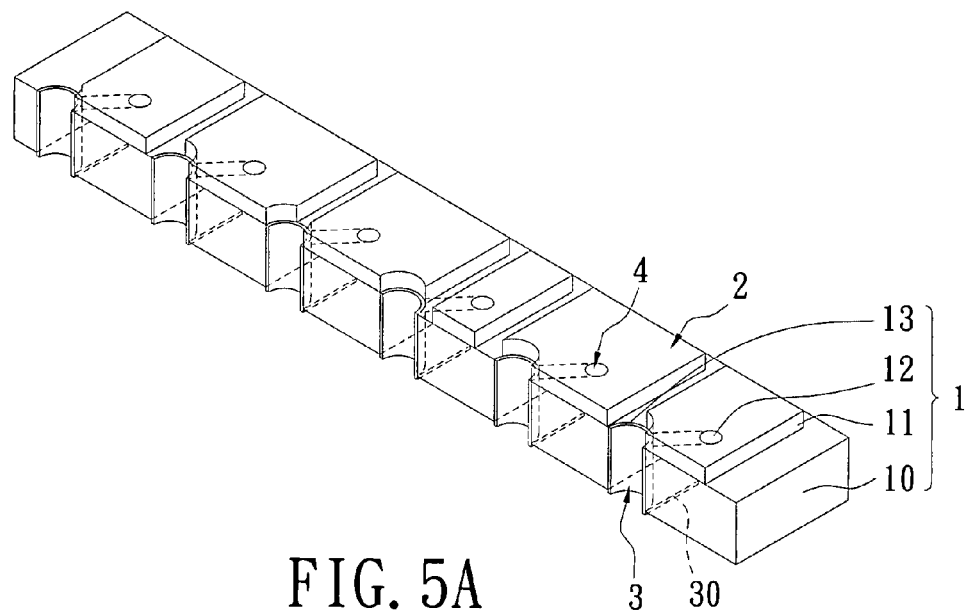
FIGS. 5A to 5C are manufacturing flowcharts of a method for manufacturing a penetrating hole type LED chip package structure that uses a ceramic material as a substrate according to the first embodiment of the present invention, respectively.
Figure 5B:
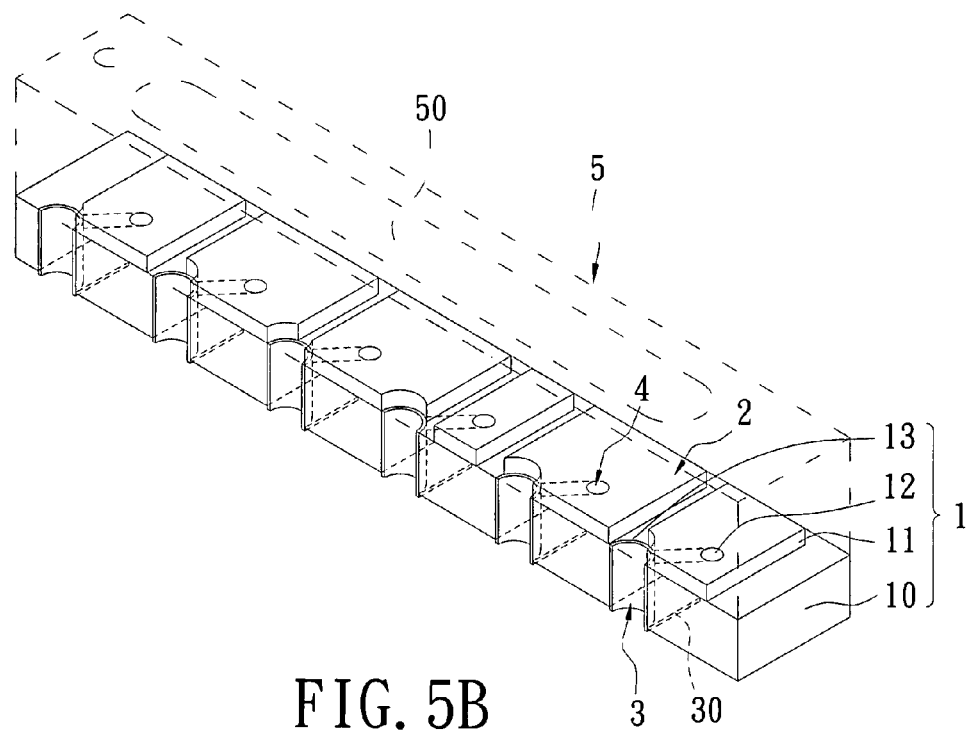
Figure 5C:
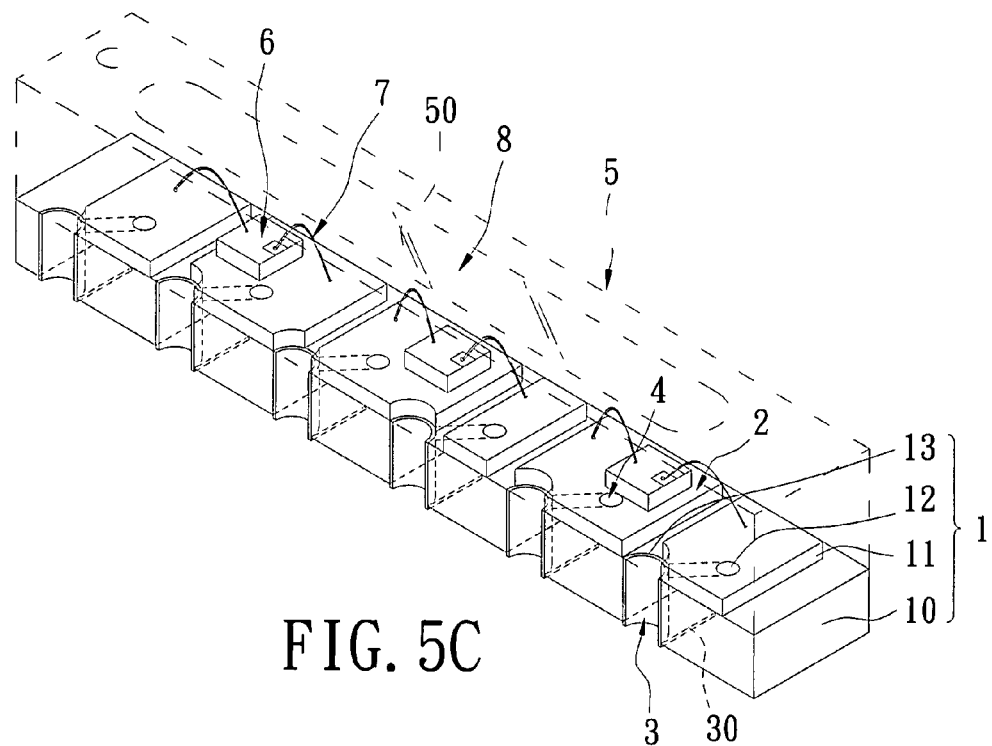
Figure 6:
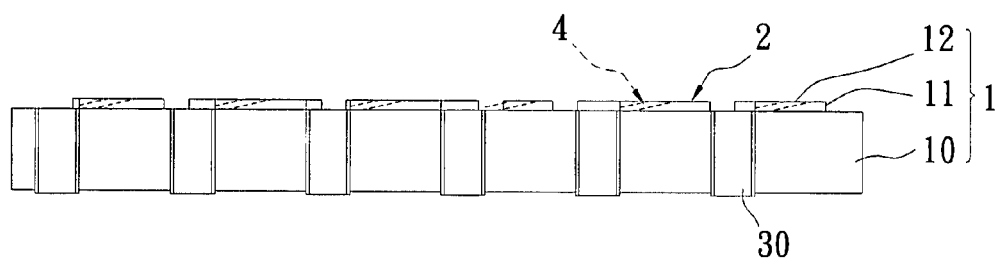
FIG. 6 is a front, schematic view of a penetrating hole type LED chip package structure that uses a ceramic material as a substrate according to the first embodiment of the present invention.

Referring to FIGS. 4 to 6, FIG. 4 shows a flowchart of a method for manufacturing a penetrating hole type LED chip package structure that uses a ceramic material as a substrate according to the first embodiment of the present invention; FIGS. 5A to 5C show manufacturing flowcharts of the first embodiment, respectively; FIG. 6 shows a front, schematic view of the first embodiment. The first embodiment provides a method for manufacturing a penetrating hole type LED chip package structure using a ceramic material as a substrate. The method of the first embodiment includes: referring to FIGS. 5A and 6, providing a ceramic substrate 1 that has a main body 10, a plurality of protrusions 11 separated from each other and extended from a top face of the main body 10, a plurality of penetrating holes 12 respectively penetrating through the protrusions 11, and a plurality of half through holes 13 formed on a lateral side of the main body 10 and respectively formed between each two protrusions 11 (S100). Each penetrating hole 12 is obliquely extended from each corresponding protrusion 11 to each corresponding half through hole 13. In other words, each penetrating hole 12 is an oblique channel that is communicated between each corresponding protrusion 11 and each corresponding half through hole 13.

The method further includes: respectively forming a plurality of first conductive layers 2 on the protrusions 11 and respectively forming a plurality of second conductive layers 3 on inner surfaces of the half through holes 13 and a bottom face of the main body 10 (S102) for forming a plurality of lower pins 30; and then respectively filling a plurality of third conductive layers 4 into the penetrating holes 12, and each third conductive layer 4 being electrically connected between the first conductive layer 2 and the second conductive layer 3 (S104). In addition, the first conductive layers 2, the second conductive layers 3, and the third conductive layers 4 are silver paste layers.

Referring to FIGS. 5B and 6, the method further includes: fixing a hollow ceramic casing 5 on the top face of the main body 10 to form a receiving space 50 for exposing top faces of the first conductive layer 2 (S106). The main body 10 and the hollow ceramic casing 5 are two cuboids that are mated with each other. The hollow ceramic casing 5 is fixed on the top face of the main body 10 via an LTCC (Low-Temperature Cofired Ceramics) process.

Referring to FIGS. 5C and 6, the method further includes: receiving a plurality of LED chips 6 in the receiving space 50, and each LED chip having a positive electrode side and a negative electrode side respectively and electrically connected with the two different first conductive layer 2 (S108); and then filling a package colloid 8 into the receiving space 50 for covering the LED chips 6 (S110). Moreover, the positive electrode side and the negative electrode side of each LED chip are respectively and electrically connected with the two different first conductive layer 2 via two leading wires 7. In addition, the receiving space 50 faces top, so that bottom sides (the lower pins 30) of the second conductive layers 3 contact with a PCB (not shown). Hence, the LED chip package structure of the present invention can project light upward by vertically placing the LED chip package structure.

Figure 7:
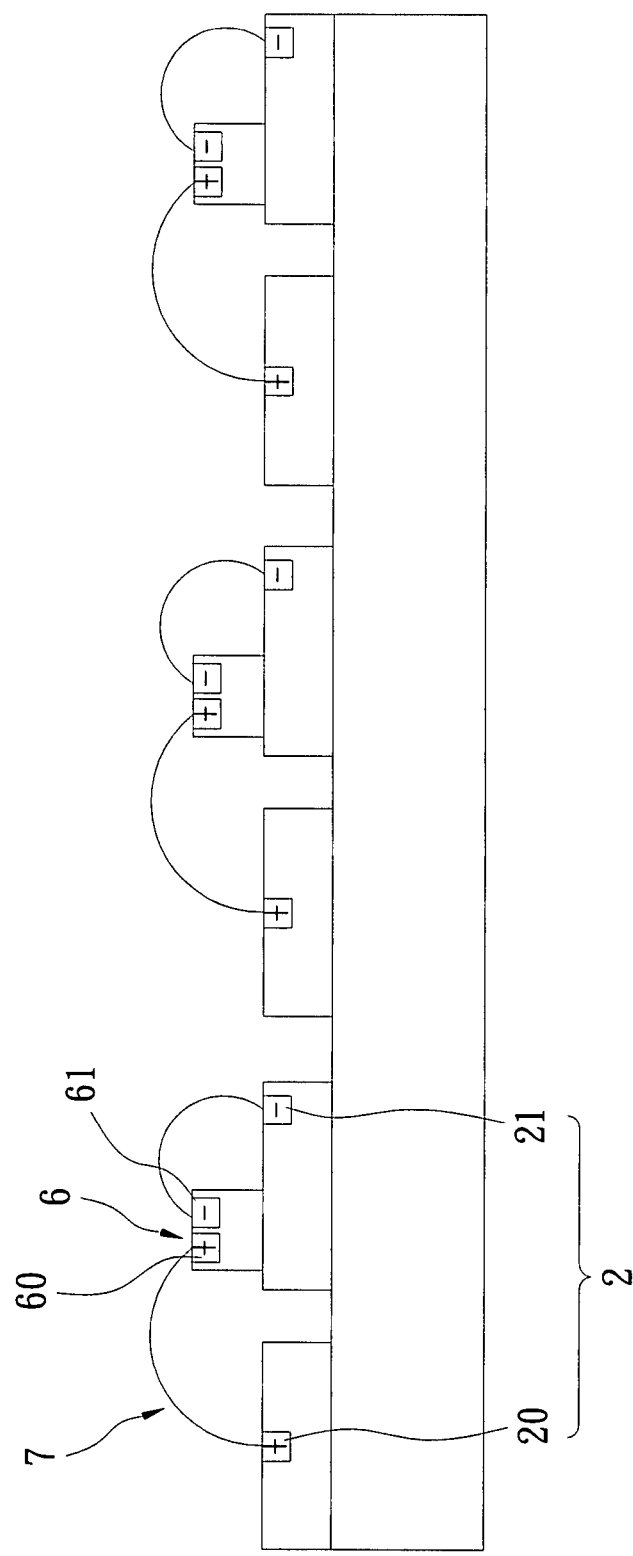
FIG. 7 is a lateral, schematic view of a first arrangement of a plurality of LED chips according to the present invention.

FIG. 7 shows a lateral, schematic view of a first arrangement of a plurality of LED chips according to the present invention. The first conductive layers 2 are divided into a plurality of positive electrode portions 20 and negative electrode portions 21. The positive electrode side 60 and the negative electrode side 61 of each LED chip 6 are arranged on an upper surface of each LED chip 6. Therefore, the positive electrode side 60 and the negative electrode side 61 of each LED chip 6 are respectively and electrically connected with the adjacent positive and negative electrode portions 20, 21 via two leading wires 21 by a wire-bounding method.

Figure 8:
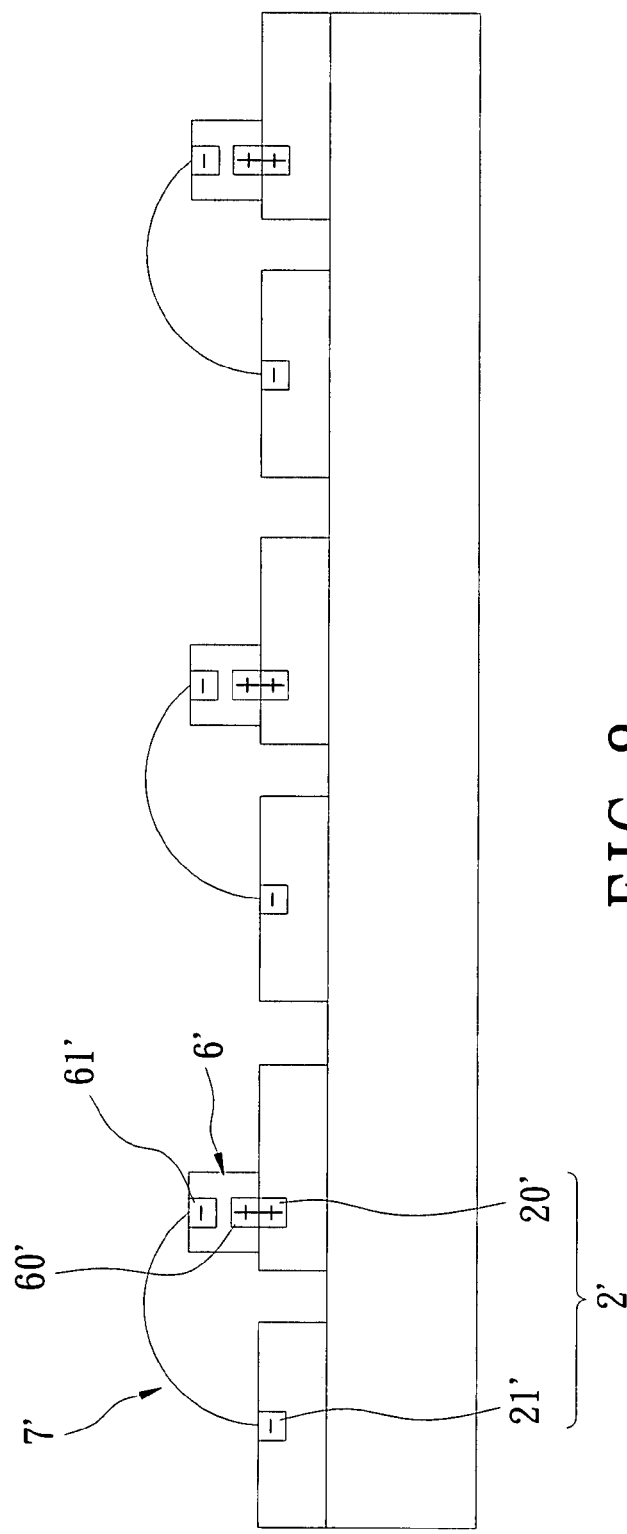
FIG. 8 is a lateral, schematic view of a second arrangement of a plurality of LED chips according to the present invention.

FIG. 8 shows a lateral, schematic view of a second arrangement of a plurality of LED chips according to the present invention. The first conductive layers 2' are divided into a plurality of positive electrode portions 20' and negative electrode portions 21'. The positive electrode side 60' and the negative electrode side 61' of each LED chip 6' are respectively arranged on a lower surface and an upper surface of each LED chip 6'. Therefore, the positive electrode side 60' of each LED chip 6' is directly and electrically connected with the corresponding positive electrode portion 20', and the negative electrode side 61' of each LED chip 6' is electrically connected with the corresponding negative electrode portion 21' via a leading wire 7' by a wire-bounding method.

Figure 9:
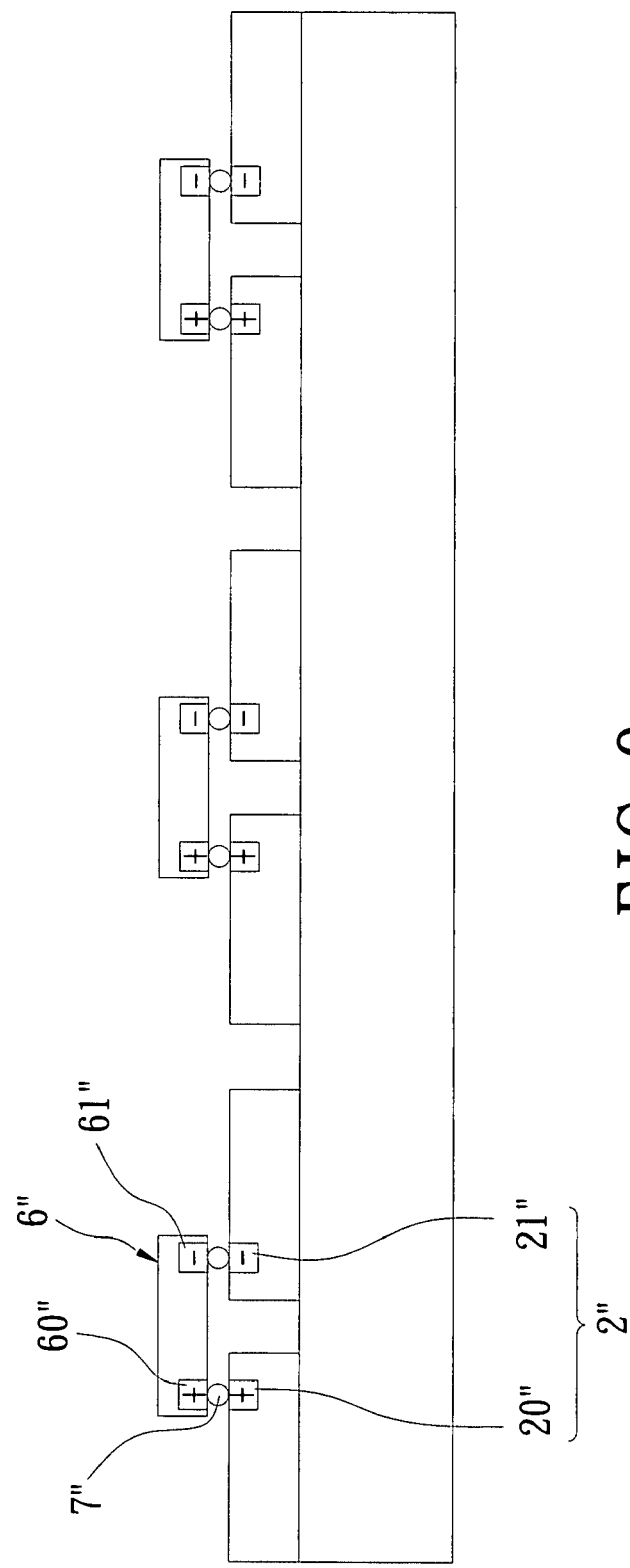
FIG. 9 is a lateral, schematic view of a third arrangement of a plurality of LED chips according to the present invention.

FIG. 9 shows a lateral, schematic view of a third arrangement of a plurality of LED chips according to the present invention. The first conductive layers 2" are divided into a plurality of positive electrode portions 20" and negative electrode portions 21". The positive electrode side 60" and the negative electrode side 61" of each LED chip 6" are arranged on a lower surface of each LED chip 6". Therefore, the positive electrode side 60" and the negative electrode side 61" of each LED chip 6" are respectively and electrically connected with the adjacent positive and negative electrode portions 20", 21" via a plurality of corresponding solder balls 7" by a flip-chip method.

Figure 10:
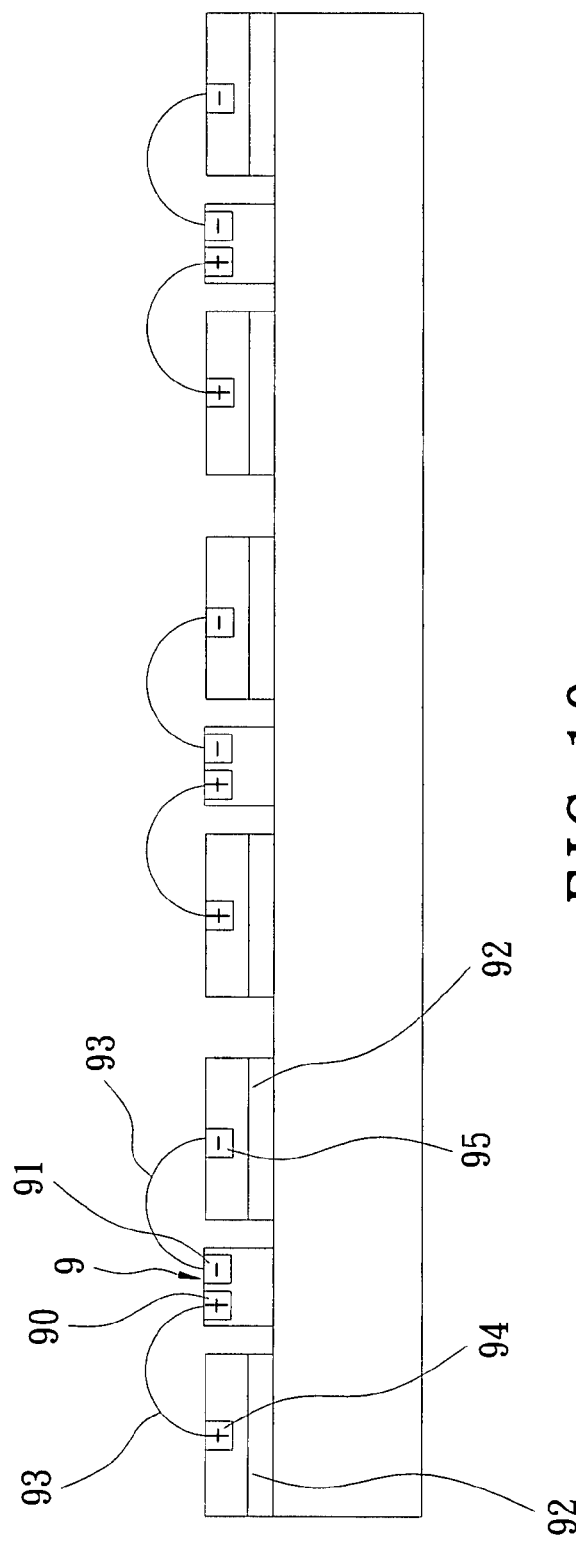
FIG. 10 is a lateral, schematic view of a fourth arrangement of a plurality of LED chips according to the present invention.

FIG. 10 shows a lateral, schematic view of a fourth arrangement of a plurality of LED chips according to the present invention. The positive electrode side 90 and the negative electrode side 91 of each LED chip 9 are arranged on an upper surface of each LED chip 9, and each LED chip 9 is disposed between each two protrusions 92. Therefore, the positive electrode side 90 and the negative electrode side 91 of each LED chip 9 are respectively and electrically connected with the adjacent positive and negative electrode portions 94, 95 via two leading wires 93 by a wire-bounding method.

In conclusion, the advantage of the present invention is that the conductive layers (the first conductive layers 2, the second conductive layers 3, and the third conductive layers 4) are formed on the ceramic substrate 1 via any forming method, and the hollow ceramic casing 5 is fixed on the top face of the ceramic substrate 1 via an LTCC (Low-Temperature Cofired Ceramics). Therefore, the LED chip package structure of the present invention can electrically connect with a PCB (not shown) easily without bending the conductive pins (20a, 21a, 20b, 21b) as the prior art.

Hence, the LED chip package structure of the present invention can electrically connect with the PCB (not shown) easily without bending the conductive pins (20a, 21a, 20b, 21b) as the prior art by matching the penetrating holes 12 and the conductive layers (the first conductive layers 2, the second conductive layers 3, and the third conductive layers 4). In other words, the third conductive layers 4 are respectively filled in the penetrating holes 12 to form a plurality of conductive bridges between the first conductive layers 2 and the second conductive layers 3 or between the LED chips 6 and the PCB. Therefore, the present invention can reduce manufacturing process and cost.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A penetrating hole type LED chip package structure using a ceramic material as a substrate, comprising:
   a ceramic substrate having a main body and a plurality of protrusions separated from each other and extended from a top face of the main body, said ceramic substrate having a plurality of half through holes formed on a lateral side of the main body and each positioned between neighboring protrusions, each protrusion including a penetrating hole offset from said half through holes, a channel extending in an obliquely angled manner through each protrusion from one said penetrating hole to one of said half through holes;
   a conductive unit having a plurality of first conductive layers, each formed on a respective one of said plurality of protrusions, a plurality of second conductive layers, each formed on an inner surface of a respective one of said plurality of half through holes and a bottom face of the main body, and a plurality of third conductive layers, each filling one said channel, wherein each said third conductive layer is electrically connected between a respective one of said plurality of first conductive layers formed on said plurality of protrusions and one of said plurality of the second conductive layers formed on said inner surface of one of said plurality of half through holes and the bottom face of the main body;
   a hollow ceramic casing fixed on the top face of the main body to form a receiving space for exposing top faces of the first conductive layer;
   a plurality of LED chips received in the receiving space, wherein each LED chip has a positive electrode side and a negative electrode side, respectively, said positive and negative electrode sides of said each LED chip being electrically connected with said first conductive layers formed on respective neighboring two of said plurality of protrusions; and
   a package colloid filled in the receiving space for covering the LED chips.

2. The penetrating hole type LED chip package structure as claimed in claim 1, wherein the main body and the hollow ceramic casing are two cuboids that are mated with each other.

3. The penetrating hole type LED chip package structure as claimed in claim 1, wherein the first conductive layers, the second conductive layers, and the third conductive layers are silver paste layers.

4. The penetrating hole type LED chip package structure as claimed in claim 1, wherein the receiving space faces top, so that bottom sides of the second conductive layers contact with a printed circuit board.

5. The penetrating hole type LED chip package structure as claimed in claim 1, wherein the first conductive layers are divided into a plurality of positive electrode portions and negative electrode portions.

6. The penetrating hole type LED chip package structure as claimed in claim 5, wherein the positive electrode side and the negative electrode side of each LED chip are arranged on an upper surface of each LED chip, and wherein the positive electrode side and the negative electrode side of each LED chip are electrically connected with neighboring positive and negative electrode portions via two leading wires by a wire-bounding method.

7. The penetrating hole type LED chip package structure as claimed in claim 5, wherein the positive electrode side and the negative electrode side of each LED chip are respectively arranged on a lower surface and an upper surface of each LED chip; whereby, the positive electrode side of each LED chip is directly and electrically connected with a corresponding positive electrode portion, and the negative electrode side of each LED chip is electrically connected with a corresponding negative electrode portion via a leading wire by a wire-bounding method.

8. The penetrating hole type LED chip package structure as claimed in claim 5, wherein the positive electrode side and the negative electrode side of each LED chip are arranged on a lower surface of each LED chip; whereby, the positive electrode side and the negative electrode side of each LED chip are respectively and electrically connected with adjacent positive and negative electrode portions via a plurality of corresponding solder balls by a flip-chip method.

9. The penetrating hole type LED chip package structure as claimed in claim 5, wherein the positive electrode side and the negative electrode side of each LED chip are arranged on an upper surface of each LED chip, each LED chip being disposed between each two protrusions, and wherein the positive electrode side and the negative electrode side of said each LED chip are electrically connected with neighboring positive and negative electrode portions via two leading wires by a wire-bounding method.

* * * * *